United States Patent [19]
Hopp

[11] 3,936,928
[45] Feb. 10, 1976

[54] METHOD FOR PROVIDING MOUNTING ASSEMBLIES FOR A PLURALITY OF TRANSISTOR INTEGRATED CIRCUIT CHIPS

[75] Inventor: Gene P. Hopp, Wheeling, Ill.

[73] Assignee: Motorola, Inc., Chicago, Ill.

[22] Filed: Apr. 21, 1975

[21] Appl. No.: 570,297

Related U.S. Application Data

[63] Continuation of Ser. No. 403,370, Oct. 4, 1973, abandoned.

[52] U.S. Cl. .................. 29/577; 29/589; 29/591; 174/52 FP
[51] Int. Cl.² .......................................... B01J 17/00
[58] Field of Search .......... 29/576 S, 591, 577, 588, 29/589, 626; 174/52 FP

[56] References Cited
UNITED STATES PATENTS

| | | | |
|---|---|---|---|
| 2,964,431 | 12/1960 | Kalish | 29/589 |
| 3,254,274 | 5/1966 | Garcia | 174/52 FP |
| 3,271,507 | 9/1966 | Elliott | 29/576 S |
| 3,494,022 | 2/1970 | Maute | 29/588 |
| 3,549,782 | 12/1970 | Reifel | 29/576 S |
| 3,577,633 | 5/1971 | Homma | 29/576 S |
| 3,691,289 | 9/1972 | Rohloff | 174/52 FP |

Primary Examiner—W. Tupman
Attorney, Agent, or Firm—James W. Gillman; Donald J. Lisa

[57] ABSTRACT

A mounting assembly for a power transistor integrated circuit chip having a pair of electrodes on one surface thereof comprising base and emitter connections and a third electrode on the opposite surface thereof comprising the collector connection, is fabricated by the method including the steps of providing an electrically conductive strip having a central cavity extending the length thereof, the depth of the cavity being substantially equal to the height of the chip and the strip also including arms extending outwardly at opposite sides of the cavity; tinning the strip with solder; placing transistor chips in the cavity adjacent each other with the collector electrodes thereof being in contacting engagement with the strip; heating the strip with the chips therein to reflow the solder for connecting the chips thereto at the collector electrode; and severing the strip transverse the length thereof between chips to provide individual power transistor chip mounting assemblies each having a pair of outwardly extending support feet formed from the severed arms of the strip. The mounting assembly can be mounted to printed circuit conductors which are in-line by soldering the support feet to predetermined ones of the conductors and the base and emitter electrodes to others of the conductors.

6 Claims, 7 Drawing Figures

METHOD FOR PROVIDING MOUNTING ASSEMBLIES FOR A PLURALITY OF TRANSISTOR INTEGRATED CIRCUIT CHIPS

This is a continuation of application Ser. No. 403,370, filed Oct. 4, 1973, now abandoned.

BACKGROUND

This invention relates generally to an assembly and method for mounting a semi-conductor device on a printed circuit board or the like and more particularly to an assembly and method of mounting a power transistor integrated circuit chip on a printed circuit board.

Conventionally, when mounting transistor chips of the type having a collector electrode on one surface and individual base and emitter electrodes extending from the opposite surface, sometimes in the shape of a ball on a printed circuit board, the collector electrode is first soldered to a printed metallic electrode and thereafter separate straps are soldered at first ends to the base and emitter electrodes, respectively, and at the opposite ends, to other printed metallic electrodes.

The last described mounting technique requires many individual steps which can raise the cost of the final circuit assembly considerably. Furthermore, the technique is timeconsuming and inefficient.

SUMMARY

Accordingly, it is a general object of the present invention to provide a new and improved assembly and method for mounting semi-conductor components on a printed circuit board which overcomes the drawbacks of the prior art techniques.

It is another, more specific object of the present invention to provide a new and improved assembly and method for mounting semi-conductor components of the type including power transistor chips having a first electrode on one surface with one or more electrodes on the opposite surface, on a printed circuit board while avoiding the drawbacks described heretofore.

Briefly, the method according to the invention comprises the steps of providing an elongated electrically conductive mounting strip or channel, preferably of a copper alloy. The strip includes a longitudinally extending cavity the depth of which is substantially equal to the height of a transistor chip to be mounted on a printed circuit assembly. Arms extend outwardly from the strip on opposite sides of the cavity and run the length of the strip. The strip is tinned with solder and an excess of solder is deposited in the channel. The strip is prescored across the width thereof at predetermined locations.

After tinning, a plurality of transistor chips are placed in the channel between the scored locations, with the collector electrodes in engagement with the excess solder in the channel. The base and emitter electrodes of the transistor chip extend upwardly therefrom and are substantially in the same plane as the arms of the mounting strip. Heating the assembly thereafter reflows the solder to join the transistor chip to the mounting strip. Once joined, the transistor chips may be tested and thereafter separated from each other along the prescored marks to provide individual transistor mounting assemblies. The transistor mounting assemblies are thereafter mounted on suitable printed metallic terminals or conductors by soldering the outwardly extending end tabs of the strip to first and second printed metallic terminals of the printed circuit board and the base and emitter terminals to other printed metallic terminals located between the first and second printed terminals. The lastmentioned soldering is accomplished by heating the assembly in a suitable furnace thereby causing the solder to reflow. No damage occurs to the printed circuit board as it is composed of a ceramic material.

DETAILED DESCRIPTION

Figure 1:
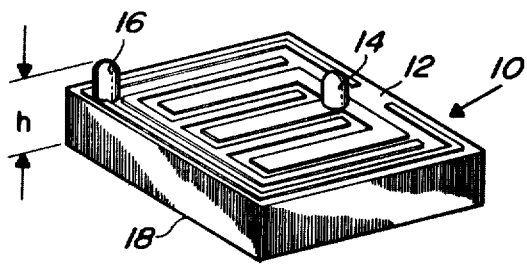
FIG. 1 is an enlarged, perspective view of a power transistor integrated circuit chip of the type having outwardly extending base and emitter electrodes on one surface thereof and a collector electrode along the opposite surface thereof.

Referring now to the drawings in greater detail wherein like numerals have been employed throughout the various views to designate similar components, there is shown in FIG. 1 a power transistor integrated circuit chip of the type for which a mounting assembly and method for providing such assembly has been devised according to the invention.

The power transistor chip is rectangular in shape having on a first surface 12 thereof a pair of spaced, copper alloy terminals 14, 16. The terminals are rounded or slightly ball-shaped and are connected to the base and emitter electrodes of the transistor chip. The opposite surface 18 of the transistor chip makes up the collector electrode thereof.

Figure 2:
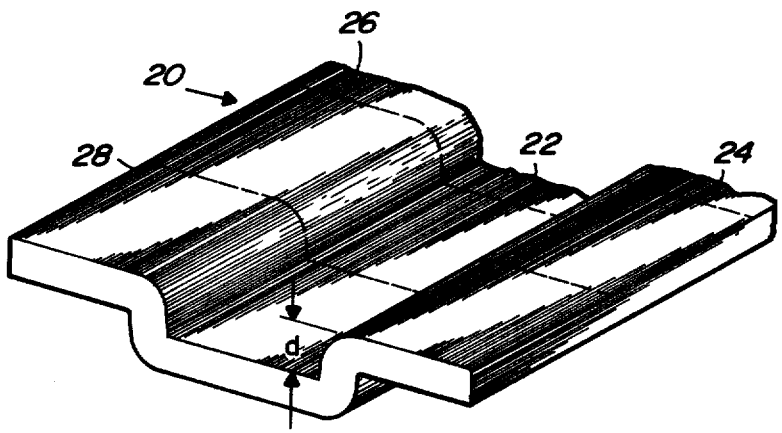
FIG. 2 is an enlarged, fragmentary, perspective view of a mounting channel used for mounting transistor chips of the type shown in FIG. 1 according to the method of the invention.

To prepare mounting assemblies for power transistor chips of the type shown in FIG. 1 according to the invention, there is provided an electrically conductive, copper alloy mounting channel or strip 20 like that shown in FIG. 2 of the drawings. The channel is elongated having a central cavity 22 extending the length thereof. A pair of arms 24, 26 integrally formed with the channel extend outwardly at opposite sides of the central cavity. The depth $d$ of the cavity is substantially equal to the height $h$ of the power transistor 10 measured from the free end of the ball terminals to the opposite surface thereof, (See FIG. 1).

The mounting channel 20 is scored as shown along lines such as 28 which are spaced predeterminedly from each other to easily separate the channel into mounting members for individual power transistor chips 10.

To accomplish the fabrication of the transistor mounting assemblies, the copper alloy channel is first pre-tinned by application of solder in a bath or the like manner. The solder used for this purpose is one which is termed a "hard" solder, requiring a rather high temperature, in the area of 250°C, to cause it to flow. An excess of solder 23 is preferably deposited in the central cavity 22 of the channel.

Figure 3:
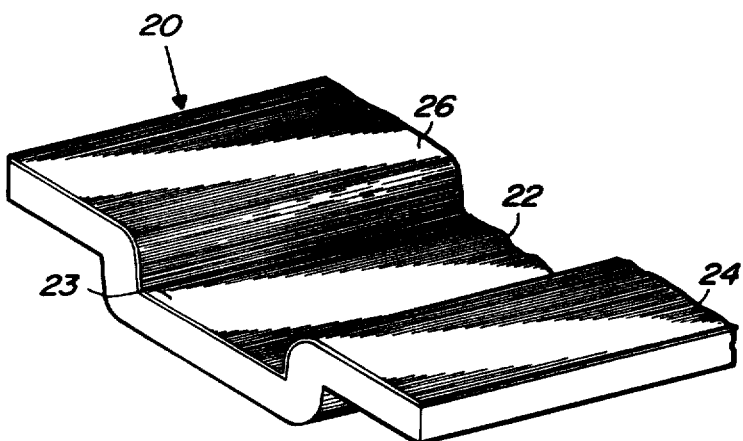
FIG. 3 is an enlarged, fragmentary, perspective view of the mounting channel of FIG. 2 after it has been tinned with solder according to the method of the invention.
Figure 4:
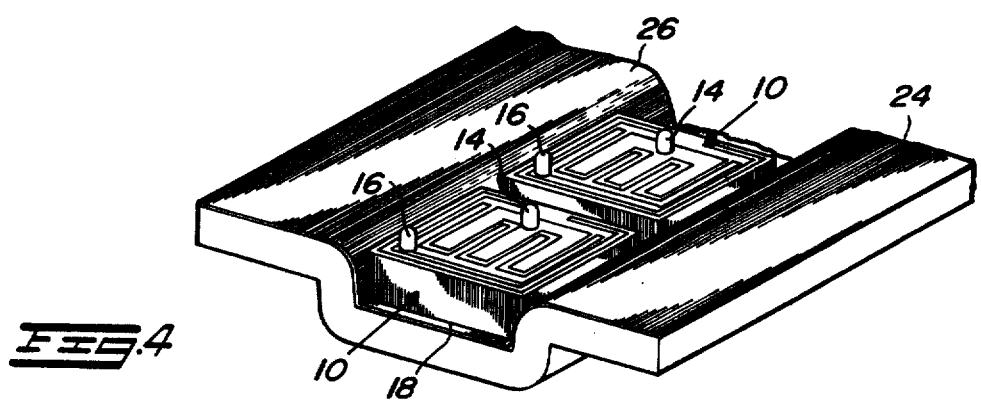
FIG. 4 is an enlarged, fragmentary, perspective view of the mounting channel of FIG. 3 with a plurality of transistor chips shown in FIG. 1 placed therein for attachment thereto, according to the method of the invention.

Once tinned, as shown in FIG. 3, individual power transistor chips are placed in the cavity 22 with the collector electrode 18 thereof being in contacting engagement with the tinned surface thereof. The transistor chips are spaced from each other slightly. Once positioned in the cavity, the channel with the transistor chips is placed into an oven or furnace for a short time to permit the reflow of the solder, whereby the collector electrodes of the transistor chips are soldered to the channel.

Figure 5:
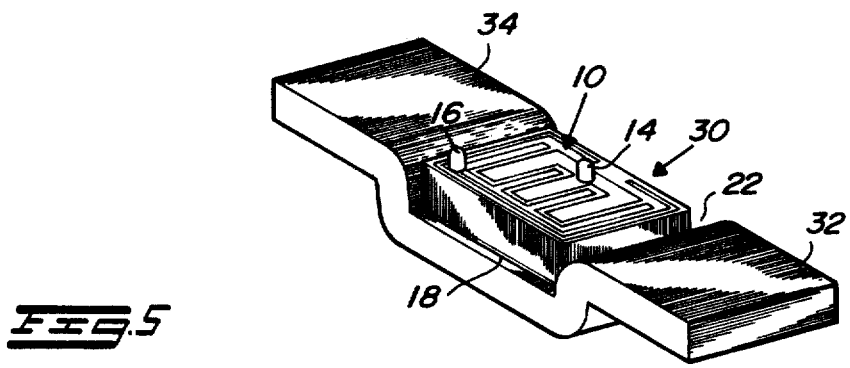
FIG. 5 is a perspective view of a completed mounting assembly for a transistor chip of the type shown in FIG. 1, fabricated in accordance with the method of the invention.

Once the power transistor chips are attached to the channel as described, the channel is severed along the perforations or scored lines 28 to provide individual transistor chip mounting assemblies, such as 30, shown in FIG. 5. Each mounting assembly 30 includes a transistor chip 10 mounted at a first electrode 18 thereof in the cavity 22 of a particular channel section severed from the channel 20. The assembly includes mounting or support pads or feet 32, 34, which are formed from the severed arms 24, 26 of the original elongated channel member. As mentioned heretofore, the terminals 16, 18, extend outwardly into a plane in which the feet 32, 34 of the mounting channel section lie.

Figure 6:
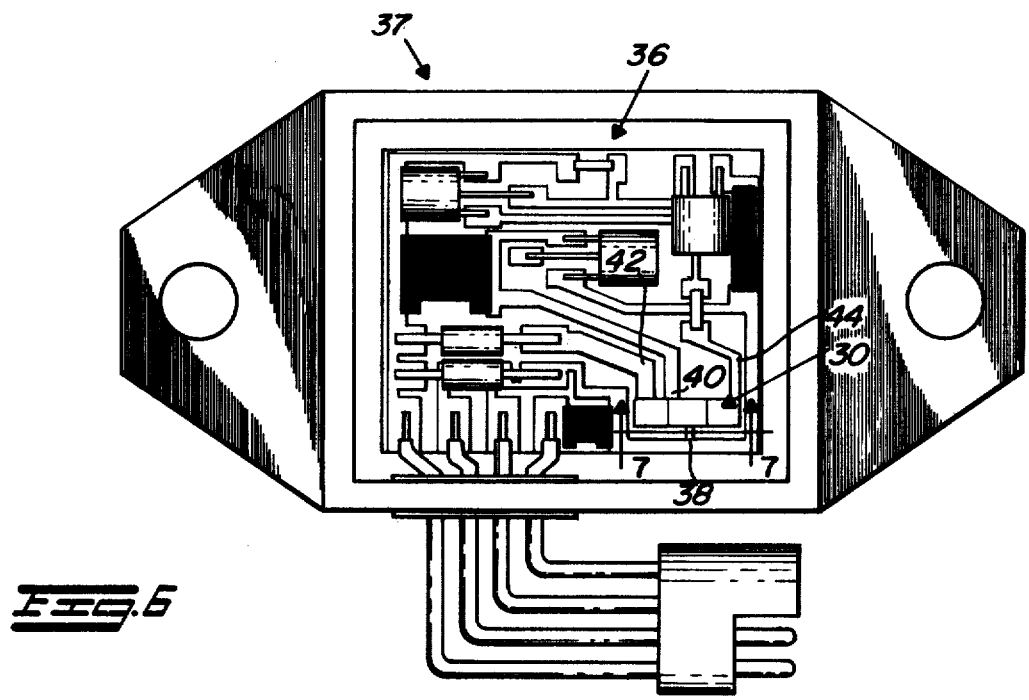
FIG. 6 is a top, plan view of a voltage regulator device including a transistor chip connected to the printed circuit portion thereof with a mounting assembly according to the invention.
Figure 7:
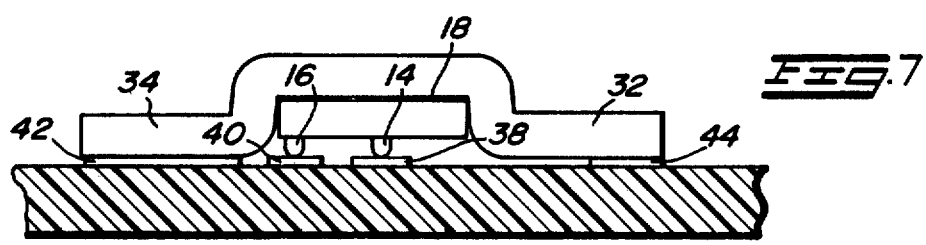
FIG. 7 is a side, sectional view of the voltage regulator device of FIG. 6 taken along the line 7-7.

To mount the power transistor assembly on a printed circuit board substrate, such as 36 of a solid state voltage regulator or the like device 37, FIG. 6, which includes adjacent parallel printed circuit conductors, such as 38, 40, 42, 44 (See FIG. 7), the conductor leads are first tinned, preferably with a solder compound that flows at a temperature lower than the solder used to connect the power transistor chip to the channel section. Typical solder for this use is that which flows at a temperature of approximately 400°F. The pre-tinning can also take place in a solder bath.

Once the conductors of the printed circuit board are properly tinned, the mounting assembly is placed thereon with the feet thereof in contacting engagement with predetermined ones of the conductors, 42, 44 and the base and emitter terminals 14, 16 of the power transistor chip in contacting engagement with the remaining conductors 38, 40. Thereafter, the tinned conductors are heated so the solder reflows and the power transistor assembly is thereby connected thereto.

The feet 32, 34 of the mounting assembly provide support therefor as well as a connection to the transistor collector electrode of the chip. In addition, the overlying channel section protects the transistor chip, and more importantly, serves as a heat sink therefor in use.

The method for preparing power transistor chip mounting assemblies as described heretofore is relatively simple to carry out, and provides an easily mountable power transistor assembly. The mounting assembly lends itself for use in the fabrication of solid state devices such as, for example, the voltage regulator device 37 of FIG. 6.

While a particular embodiment and method of the invention has been shown and described, it should be understood that the mounting assembly and method for preparing the assembly are not limited thereto since many modifications may be made. It is therefore contemplated to cover by the present application any and all such modifications as fall within the true spirit and scope of the appended claims.

I claim:

1. The method of providing a plurality of individual mounting assemblies, each assembly supporting a semiconductor component, each said component having at least a first electrode on one surface thereof and a second electrode on the opposite surface thereof, comprising the steps of:
    forming one continuous electrically conductive strip having an upper surface and one continuous central cavity formed therein extending the length thereof, said cavity being of a depth substantially equal to the height of said semiconductor components including said electrodes, said strip having a pair of arms extending the length thereof and protruding outwardly therefrom, one on each side of said cavity,
    first tinning said arms and central cavity portions of said upper surface of said strip with solder,
    then placing said semiconductor components in said cavity in spaced relation so that a first one of said electrodes of each said components is in contacting engagement with said strip in said cavity,
    reheating said strip to a temperature whereby said solder flows to attach said semiconductor components to said strip at said first electrodes, and
    severing said strip as provided in the heating step transversely between adjacent semiconductor components to provide said plurality of individual mounting assemblies with an individual semiconductor component supported on each mounting assembly.

2. The method of claim 1 wherein said semiconductor components each include a transistor having base and emitter electrodes provided on said one surface and extending outwardly therefrom a predetermined distance and a collector electrode formed on the opposite surface thereof, and wherein the forming step includes forming the depth of said cavity substantially equal to the height of said transistor measured from the free ends of said base and emitter electrodes to said collector electrode to place said free ends in the plane including the upper surface of both arms.

3. The method of claim 1 further comprising the step of prescoring the strip transverse the length thereof between semiconductor components and wherein the step of severing said strip between adjacent semiconductor components comprises the step of breaking the strip at said prescored locations.

4. The method of preparing mounting assemblies for a plurality of semiconductor chips each having first and second electrodes extending outwardly from a first surface thereof and a third electrode formed on the opposite surface thereof, and for mounting said assemblies on a circuit board substrate having first, second, third and fourth conductors thereon, comprising the steps of:
    forming an electrically conductive strip having an upper surface formed with a central cavity extending longitudinally thereof, said cavity being of a depth substantially equal in height to a semiconductor chip as measured from the free ends of said first and second electrodes to said third electrode, said upper surface of said conductive strip being further formed with a pair of arms extending outwardly therefrom at opposite sides of said cavity, said arms extending the length of said strip and being in the plane including the said free ends, first tinning the arms and cavity portions of the upper surface of the strip with solder meltable at a first temperature;

then placing the plurality of semiconductor chips in said cavity in a side-by-side relation, with the third electrodes of each said semiconductor chips being in contacting engagement with said strip;

reheating said strip with said semiconductor chips in place to a temperature whereby said solder is melted to join said semiconductor chips to said strip in said cavity at the third electrodes thereof;

severing said strip transversely thereof between semiconductor chips to provide individual mounting assemblies for said semiconductor chips, each said mounting assembly including a pair of support feet comprising the upper surface of said pair of arms extending outwardly therefrom at opposite sides thereof formed from the severed arms of said strip; and mounting said individual assembly on said substrate by soldering, with said feet in contacting engagement with said first and fourth conductors and said first and second electrodes of said semiconductor chip in contacting engagement with said second and third conductors.

5. The method of claim 4 further comprising the step of pre-tinning said conductors on said circuit board substrate with a solder which flows when heated to a temperature well below the temperature of said solder used to connect said semiconductor chips to said strip, and whereby said semiconductor chip mounting assemblies are connectible to said conductors by reheating said substrate with said semiconductor chip mounting assemblies in place thereon.

6. The method of claim 4 wherein the mounting step includes inverting the mounting assembly relative to the substrate and juxtaposing said upper surface portions of said feet into contacting engagement with said first and fourth conductors while simultaneously juxtaposing the ends of the first and second electrodes into contacting engagement with said second and third conductors.

* * * * *